(12) United States Patent
Swaminathan

(10) Patent No.: US 7,902,060 B2
(45) Date of Patent: Mar. 8, 2011

(54) ATTACHMENT USING MAGNETIC PARTICLE BASED SOLDER COMPOSITES

(75) Inventor: Rajasekaran Swaminathan, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 63 days.

(21) Appl. No.: 12/343,341

(22) Filed: Dec. 23, 2008

(65) Prior Publication Data
US 2010/0159692 A1 Jun. 24, 2010

(51) Int. Cl.
*H01L 21/00* (2006.01)
(52) U.S. Cl. .......................... 438/614; 438/612
(58) Field of Classification Search ........... 438/612–617
See application file for complete search history.

(56) References Cited

U.S. PATENT DOCUMENTS

| | | | | |
|---|---|---|---|---|
| 3,839,727 A | * | 10/1974 | Herdzik et al. | 257/737 |
| 5,048,744 A | * | 9/1991 | Chang et al. | 228/123.1 |
| 5,093,545 A | * | 3/1992 | McGaffigan | 219/616 |
| 5,838,069 A | * | 11/1998 | Itai et al. | 257/766 |
| 5,907,786 A | * | 5/1999 | Shinomiya | 438/614 |
| 7,213,329 B2 | * | 5/2007 | Kim et al. | 29/829 |

OTHER PUBLICATIONS

Calabro, Joshua D., et al. "Magnetically Driven Three-Dimensional Manipulation and Inductive Heating of Magnetic-Dispersion Containing Metal Alloys", Department of Mechanical Engineering, Yale University, New Haven, CT 06520; and Department of Materials Science and Engineering, Massachusetts Institute of Technology, Cambridge, MA 02139, Mar. 16, 2010, vol. 107 No. 11 pp. 4834-4839.

McCormack, M. et al., "Enhanced Solder Alloy Performance by Magnetic Dispersions", IEEE Transactions on Components, Packaging, and Manufacturing Technology-Part A, vol. 17, No. 3, Sep. 1994, pp. 452-457.

Suwanwatana, W. et al., "Influence of particle size on hysteresis heating behavior of nickel particulate polymer films", Composites Science and Technology 66, May 30, 2006, pp. 2825-2836.

U.S. Appl. No. 12/787,968, filed May 26, 2010, 29 pages.
U.S. Appl. No. 12/778,335, filed May 12, 2010, 43 pages.
U.S. Appl. No. 12/778,313, filed May 12, 2010, 33 pages.
U.S. Appl. No. 12/777,476, filed May 11, 2010, 41 pages.
U.S. Appl. No. 12/768,842, filed Apr. 28, 2010, 33 pages.

Habib, et al., "Novel Solder-Magnetic Particle Composite and Their Reflow Using AC Magnetic Fields", IEEE Transactions on Magnetics, vol. 46, No. 6, Jun. 2010, pp. 1-4.

"Yale Scientists Develop Magnetic Lead-free Solder", SMT Magazine Archive, Mar. 8, 2010, Retrieved on Dec. 6, 2010, Document Available at: <http://www.ems007.com/pages/zone.cgi?a=60208&artpg=1>, 2 pages.

* cited by examiner

*Primary Examiner* — Richard A. Booth
(74) *Attorney, Agent, or Firm* — Winkle, PLLC

(57) ABSTRACT

Electronic devices and methods for fabricating electronic devices are described. One method includes providing a first body with a plurality of composite bumps thereon, the composite bumps comprising a solder and magnetic particles. The method also includes applying a magnetic field to the magnetic particles to generate sufficient heat to melt the solder and form molten bump regions containing the magnetic particles therein. The method also includes coupling a second body to the first body through the molten bump regions, and cooling the molten bump regions to form solidified composite bumps coupling the second body to the first body. Other embodiments are described and claimed.

17 Claims, 5 Drawing Sheets

Fig. 2
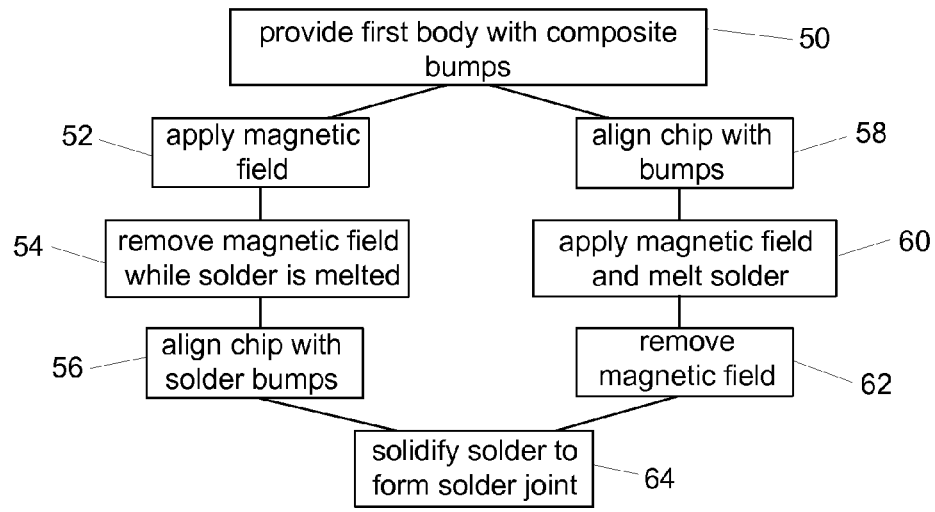
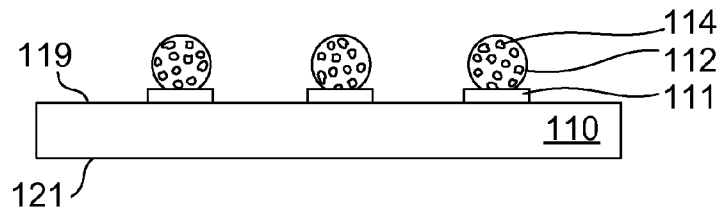
Fig. 3(A)
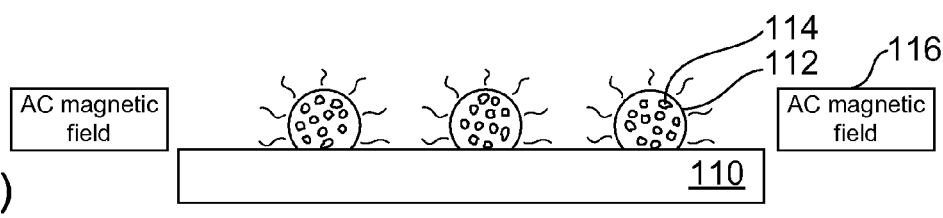
Fig. 3(B)
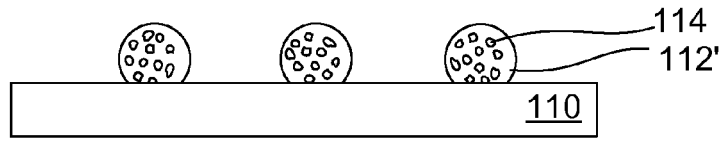
Fig. 3(C)

ATTACHMENT USING MAGNETIC PARTICLE BASED SOLDER COMPOSITES

RELATED ART

Electronic devices such as integrated circuits may be formed on wafers made of materials such as silicon. The wafers are processed to form various electronic devices. The wafers are diced into chips (a chip is also known as a die), which may then be attached to a substrate using a variety of known methods. In one type of die attach process, a die is mounted to a substrate using a conventional solder bump array in a flip chip configuration, using a method known as a C4 (controlled collapse chip connection) process, in which solder bumps are located between the die and substrate. In a C4 process, solder may be placed on pads on the active side of the die, on the substrate, or on both the die and substrate, using, for example, stencil mask printing. The solder is then melted and permitted to flow, to ensure that each bump fully wets the pad it was formed on. A second reflow operation is then carried out, and a solder connection is made between the die pads and the substrate pads. The joined package is then cooled to complete the solder bump joint. Solder bump connections may also be made between the package and a printed circuit board such as a motherboard.

Package flatness and reliability may be significantly affected by the chip attachment and package attachment processes used. Warpage and other problems caused by thermal expansion mismatch may occur due to the operations carried out at elevated temperatures. Such problems may be particularly pronounced when using lead (Pb) free solders. Warpage can lead to significant yield losses and failures due to, for example, stretched joint formation, bump cracking, under bump failures, edge failures, and layer separation. Warpage may take place during the thermal cycling of the components during the various operations, due to factors such as the coefficient of thermal expansion of the materials used, the processing temperatures, and the size of the components.

BRIEF DESCRIPTION OF THE DRAWINGS

Embodiments are described by way of example, with reference to the accompanying drawings, which are not drawn to scale, wherein:

FIG. 2 illustrates a flow chart of operations for forming an assembly using a solder containing magnetic particles and heating the solder using a magnetic field, in accordance with certain embodiments;

FIGS. 3(A)-3(C) illustrate views of the positioning of bumps containing solder and magnetic particles on the board attach side of a substrate and the reflow of the bumps using a magnetic field to couple the bumps to the substrate, in accordance with certain embodiments;

DETAILED DESCRIPTION

Certain embodiments relate to electronic devices and methods for their manufacture. In one aspect of certain embodiments, a composite material including a solder mixed with magnetic particles is used. An AC magnetic field is then applied, which causes the solder to heat up due to the interactions of the magnetic particles with the AC magnetic field. Other components in the assembly are minimally heated up by the magnetic field, which minimizes stresses in the assembly due to thermal expansion mismatch. Certain embodiments relate to the coupling of a solder bump containing magnetic particles to a substrate, using a magnetic field to heat and melt the solder. Certain embodiments also relate to coupling a first body to a second body through solder bumps containing magnetic particles, where the joint between the bodies is formed using an AC magnetic field to heat and reflow the solder. The bodies may be selected from any suitable component, including, but not limited to, chips, package substrates, and printed circuit boards.

In presence of AC magnetic fields, magnetic particles generate heat by relaxational and hysteretic loss modes. Relaxational losses occur in single domain magnetic particles and they release heat when the magnetic moment of the particle rotates with the applied magnetic field (Neel motion) and when the particle itself rotates due to Brownian motion. Hysteresis losses occur in multi-domain particles, and generate heat due to the various magnetic moments (due to multidomains) rotating against applied magnetic field. These losses occur with every cycle in an AC field, and the net heat generated increases with increasing number of field cycles. The various factors controlling heating rates may include, but are not necessarily limited to: particle size and size distribution, particle volume fractions (heat generation scales linearly with volume fraction), material choice (oxide vs. metallic and core-shell), shape anisotropy of the particle, and the applied frequency and amplitude of AC field.

Figure 1A:
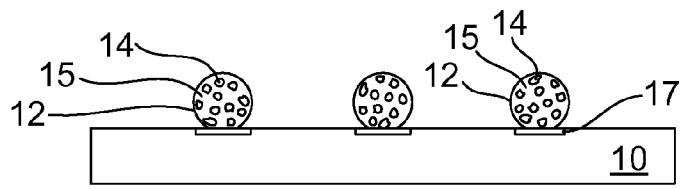
FIGS. 1(A)-1(D) illustrate views of an assembly during various operations in a process for coupling a chip to a substrate using a magnetic field to heat a solder containing magnetic particles, in accordance with certain embodiments.

FIGS. 1(A)-1(D) illustrate views of an assembly during various operations in a process for coupling a chip to a substrate using a magnetic field to heat a composite material comprising a solder containing magnetic particles, in accordance with certain embodiments. In FIG. 1(A), a plurality of bumps 12 are provided on a package substrate 10.

The bumps 12 include magnetic particles 14 positioned in a solder 15 matrix. The magnetic particles 14 may be formed from a variety of magnetic materials, including, but not necessarily limited to, metals and ceramics. Examples include iron (Fe), cobalt (Co), nickel (Ni) and their respective alloys. Examples also include ferrites and oxides containing magnetic metals, with specific examples including $MFe_2O_4$, where M is any metal, including Fe, and $BaFe_{12}O_{17}$. In certain embodiments, the particles may include a coating such as a conformal Sn/Sn based alloy/Cu layer formed, for example, by a deposition procedure such as sputtering. The coating is designed to promote desirable wetting between the molten solder and magnetic particles. The coated particles may then be placed into a molten solder bath similar to current processes used to produce solder spheres. The coating layer may also act to inhibit agglomeration and allow for uniform distribution of the particles in the molten solder.

The substrate 10 may include bonding pad regions 17 on which the bumps 12 are positioned. The bonding pad regions 17 may in certain embodiments include an ENIG/NiPdAu (electroless nickel immersion gold or nickel-palladium-gold) surface finish.

Figure 1B:
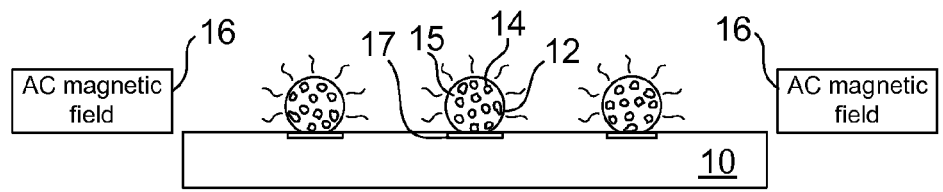
Figure 1C:
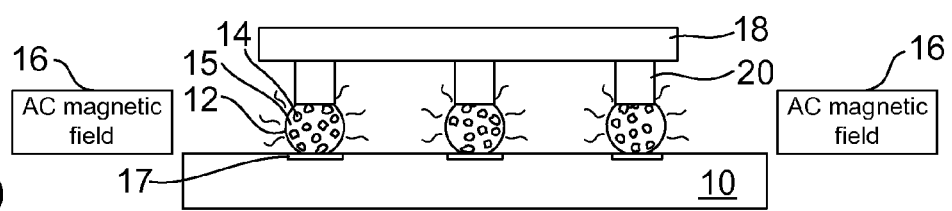

As illustrated in FIG. 1(B), an AC magnetic field is applied to the bumps 12. The alternating magnetic field causes the particles 14 to vibrate, which heats the solder 15. As seen in FIGS. 1(B)-1(C), the wavy lines extending outward near the bumps 12 illustrate the heating of the bumps 12 due to the presence of the magnetic field 16.

As illustrated in FIG. 1(C), a semiconductor chip 18 is positioned on the bumps 12. The semiconductor chip 18 may include metal pads 20, formed from, for example, copper (Cu). The pads 20 are brought into contact with the bumps 12. When formed from copper, a portion of the pads 20 may interact with the molten solder 15 and form one or more intermetallic compounds in the solder joint.

Figure 1D:
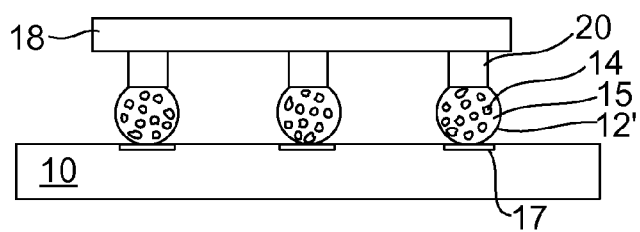

FIG. 1(D) illustrates the completed joint after the AC magnetic field 16 has been removed and the solder 15 has solidified. Depending on the interactions between the metal pads 20 and the solder 15, the size of the resultant reflowed bump 12' may be slightly larger than bump 12 prior to chip attach, due to the presence of additional material such as intermetallic compounds.

FIG. 2 illustrates a flow chart of operations for forming an assembly using a solder having magnetic particles and heating the solder using a magnetic field, in accordance with certain embodiments. Box 50 is providing a substrate with composite bumps comprising solder and magnetic particles, such as the bumps 12' described above. The coupling of the bumps to the substrate may be carried out using a magnetic field as described above, or may be carried out using conventional oven heating.

The flow chart of FIG. 2 includes two paths for forming the solder joint coupling a chip to the substrate. In the first path, Box 52 is applying a magnetic field to the bumps to heat and melt (reflow) the solder. Box 54 is removing the magnetic field once the solder is melted. Box 56 is aligning the chip with the bumps while the solder is still melted. The chip may include a plurality of pads that are brought into contact with the melted solder. Box 64 is solidifying the solder to form the joint coupling the chip to the substrate.

In the second path, Box 58 is aligning the chip with the composite bumps prior to application of the magnetic field. Box 60 is applying the magnetic field to melt solder. Box 62 is removing the magnetic field, and Box 64 is solidifying the solder to form the joint coupling the chip to the substrate. The main difference between the two approaches is that in the first, the magnetic field is only applied prior to the positioning of the chip and the bumps, whereas in the second, the magnetic field is applied after the positioning of the chip and bumps.

FIGS. 3(A)-3(C) and 4(A)-4(C) relate to coupling a package to a board such as a motherboard. FIG. 3(A) illustrates a package substrate having bumps 112 containing magnetic particles 114 positioned on the board attach side 119 of a substrate 110. The opposite side 121 of the substrate 110 is the chip attach side. The bumps 112 may be positioned on solder layer 111 that is placed on substrate bonding pads (which are not shown in FIG. 3(A)). The solder layer 111 may be formed on the substrate using a suitable method such as paste printing. In certain embodiments, the solder layer 111 may include magnetic particles such as the particles 114 in the solder bumps 112.

As illustrated in FIG. 3(B), an AC magnetic field is applied to the bumps 112, to heat and melt the solder 115. As seen in FIG. 3(B) the wavy lines extending outward near the solder bumps 112 illustrate the heating of the bumps 112 due to the presence of the magnetic field 116. FIG. 3(C) illustrates the reflowed and cooled bumps 112', which are slightly larger than the bumps 112 due to the addition of at least some of the solder from the layer 111. The bumped package substrate 110 is then ready to be coupled to another component such as a board.

Figure 4A:
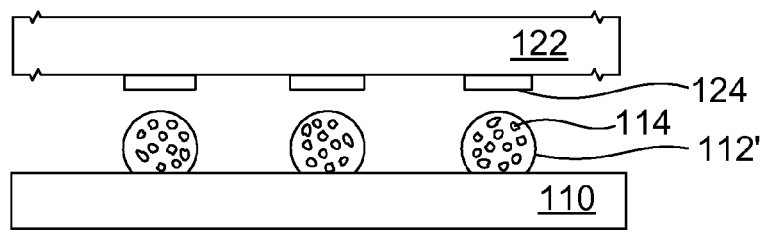
FIGS. 4(A)-4(C) illustrate views of an assembly during various operations in a process for coupling a substrate to a board using a magnetic field to heat a solder containing magnetic particles, in accordance with certain embodiments.
Figure 4B:
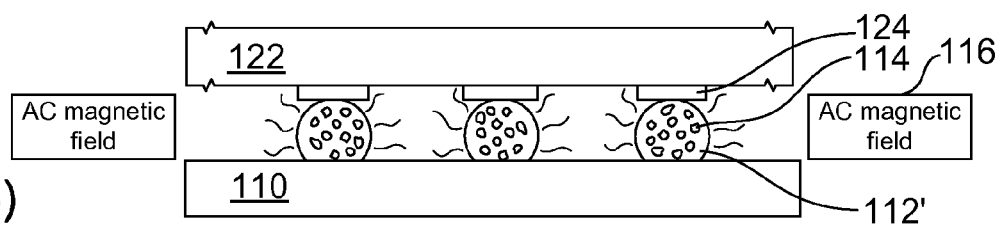
Figure 4C:
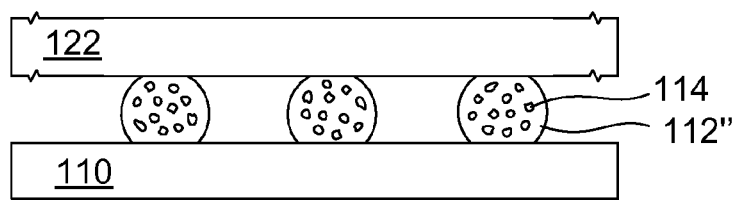

FIGS. 4(A)-4(C) illustrate operations in a board attach process, in which the package substrate 112 and a board 122 are coupled together through the bumps 112'. FIG. 4(A) illustrates the board 122 and the substrate 110 having the bumps 112' coupled thereto. The board 122 may include a solder layer 124 positioned on bonding pads (not shown in FIG. 4(A). FIG. 4(B) illustrates the positioning of the board 122 and substrate 110, with the solder layer 124 on the board 122 being brought into contact with the bumps 112' on the substrate 110. The AC magnetic field 116 is applied to melt the bumps 112'. FIG. 4(C) illustrates the cooled and completed joint between the substrate 110 and board 122, with the reflowed bump 112" being slightly larger than the bonding pad 112' due to the addition of at least some of the solder from the layer 124.

Figure 5:
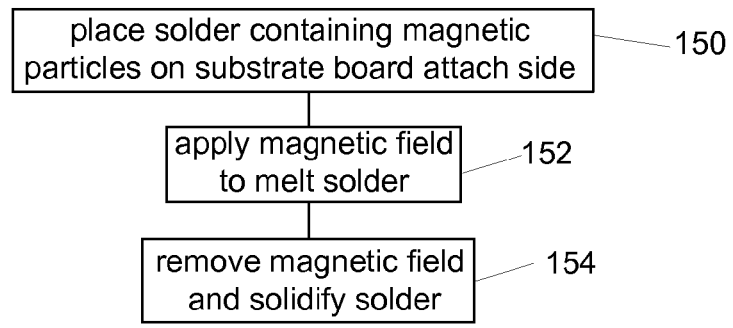
FIG. 5 illustrates a flow chart of operations for coupling bumps containing solder and magnetic particles to a substrate, in accordance with certain embodiments.

FIG. 5 illustrates a flow chart of operations for forming composite bumps containing solder and magnetic particles on a package substrate board attach side, in accordance with certain embodiments. Box 150 is placing bumps comprising solder and magnetic particles onto substrate bonding pads. The substrate bonding pads may have a solder layer thereon that the bumps are positioned on. Box 152 is applying an AC magnetic field to melt the solder and join the bump to the substrate. Box 154 is removing the magnetic field and solidifying the solder to yield a composite bump that is joined to the substrate board attach side.

Figure 6:
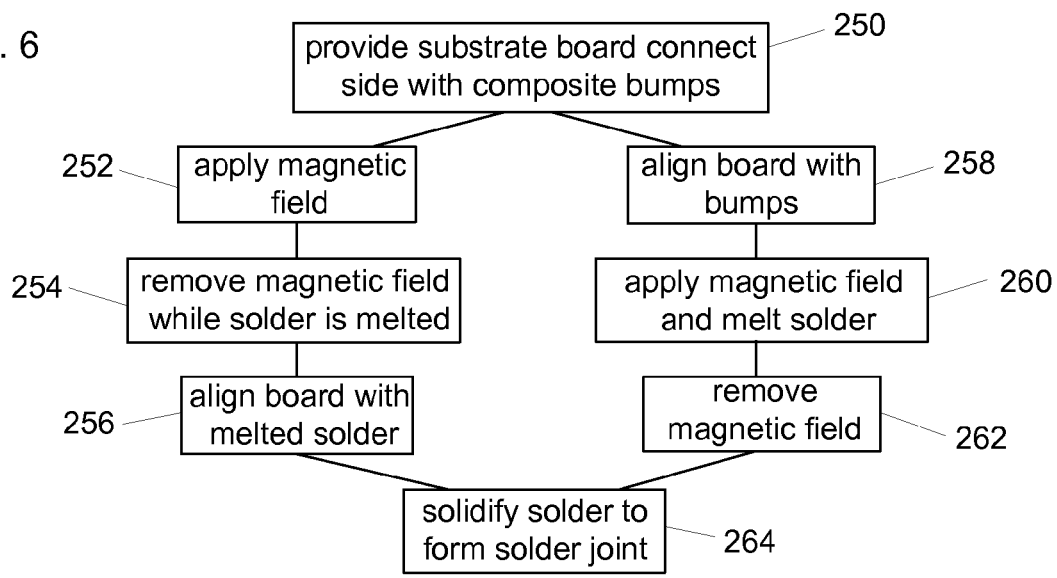
FIG. 6 illustrates a flow chart of operations for forming an assembly including a substrate coupled to a board using a magnetic field, in accordance with certain embodiments.

FIG. 6 illustrates a flow chart of operations for forming an assembly including a substrate coupled to a board using a magnetic field, in accordance with certain embodiments. Box 250 is providing a substrate board connect side with composite bumps comprising solder and magnetic particles. Similar to FIG. 2, the flow chart of FIG. 6 may take two paths. In the first path, Box 252 is applying a magnetic field to the solder bumps to heat and melt (reflow) the solder. Box 254 is removing the magnetic field once the solder is melted. Box 256 is aligning the board and the bumps while the solder is still melted. The board may include pads having a layer of solder that are brought into contact with the bumps. Box 264 is solidifying the solder to form the joint coupling the board and substrate.

In the second path, Box 258 is aligning the board and bumps prior to application of the magnetic field. Again the board may include pads having a layer of solder that are brought into contact with the solder bumps. Box 260 is applying the magnetic field to melt the solder. Box 262 is removing the magnetic field, and Box 264 is solidifying the solder to form the joint coupling the chip to the substrate. The main difference between the two approaches is that in the first, the magnetic field is only applied prior to the positioning of the board and solder bumps, whereas in the second, the magnetic field is applied after the positioning of the board and solder bumps.

Embodiments such as those described above may yield assemblies having substantially less problems due to thermal expansion mismatch than conventional attachment processes that subject the entire assembly to elevated temperatures. In embodiments as described above, the use of the AC magnetic field causes the magnetic particles to vibrate, which in turn heats up the solder. Other assembly components present in certain embodiments, for example, the substrate and the chip, can be selected and formed so that they are not magnetic and thus do not become heated by application of the AC field. While there may be some localized heating through, for example, the bonding pads, the substrate and the semiconductor chip can be kept at or close to room temperature during the attachment processes. Conventional processes using a furnace, on the other hand, subjects the components to temperatures at or above the solder reflow temperature. By not subjecting the components to substantial thermal cycling during the attach processes, stresses due to thermal expansion mismatch (that lead to undesirable warpage and premature failure) are minimized when compared to conventional attachment processes.

Figure 7:
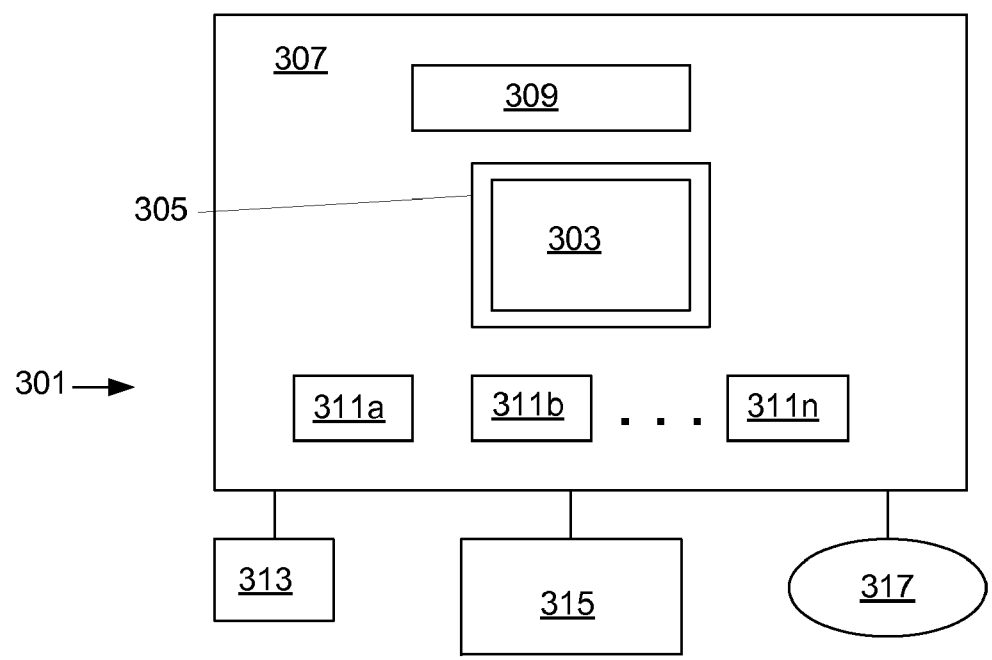
FIG. 7 illustrates an electronic system arrangement in which embodiments may find application.

Assemblies including a first body and a second body to be joined using methods such as those described above may find application in a variety of electronic components, at various interconnection levels within the assembly. FIG. 7 schematically illustrates one example of an electronic system environment in which aspects of described embodiments may be embodied. Other embodiments need not include all of the features specified in FIG. 4, and may include alternative features not specified in FIG. 7.

The system 301 of FIG. 7 may include at least one central processing unit (CPU) 303. The CPU 303, also referred to as a microprocessor, may be a semiconductor chip which is attached to an integrated circuit package substrate 305, which is then coupled to a printed circuit board 307, which in this embodiment, may be a motherboard. This is an example of an electronic device assembly that may be formed in accordance with embodiments such as described above, including the use of a solder containing magnetic particles to couple the components together. A variety of other system components, including, but not limited to memory and other components discussed below, may also include structures formed in accordance with the embodiments described above.

The system 301 may further include memory 309 and one or more controllers 311a, 311b . . . 311n, which are also disposed on the motherboard 307. The motherboard 307 may be a single layer or multi layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in individual sockets or may be connected directly to a printed circuit board. A display 315 may also be included.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The system 301 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 311a, 311b . . . 311n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
   providing a first body with a plurality of bonding pads thereon;
   providing a solder layer on the bond pads;
   providing on the solder layer, a composite material comprising a solder and magnetic particles;
   applying an alternating magnetic field to the magnetic particles to generate sufficient heat to reflow the solder on the bonding pads; and
   solidifying the reflowed solder to form composite bumps joined to the bonding pads, the composite bumps comprising the magnetic particles and the solder.

2. The method of claim 1, wherein the magnetic particles include at least one element selected from the group consisting of magnetic metals.

3. The method of claim 1, wherein the composite material includes no lead.

4. The method of claim 1, wherein the solder layer and the solder of the composite material comprise the same elements.

5. The method of claim 1, wherein the composite bumps joined to the bonding pads comprise the magnetic particles, the solder from the composite material, and the solder from the paste printed solder layer.

6. The method of claim 1, further comprising:
   providing a second body including a plurality of pads thereon;
   placing the composite bumps and the pads into position to be joined;
   applying a magnetic field to the magnetic particles in the composite bumps to generate heat and reflow the solder in the composite bumps; and
   coupling the first body to the second body through the pads on the second body and the reflowed solder.

7. The method of claim 6, further comprising stopping the applying a magnetic field after the solder in the composite bumps has been reflowed and solidifying the solder, wherein the stopping the applying a magnetic field is carried out prior to the coupling the bonding pads on the second body to the bonding pads on the first body.

8. The method of claim 6, wherein the first body comprises a semiconductor chip, the second body comprises a substrate, and the pads comprise Cu.

9. The method of claim 6, wherein the first body comprises a substrate, and the second body comprises a motherboard.

10. The method of claim 6, further comprising positioning a solder layer on the bonding pads of the second body prior placing the composite bumps and second body bonding pads into position to be joined.

11. The method of claim 1, further comprising keeping the first body at a temperature less than the reflow temperature during the formation of the composite bumps.

12. The method of claim 6, further comprising:
   keeping the first body at a temperature less than the reflow temperature during the applying a magnetic field to the magnetic particles in the composite bumps to generate heat and reflow the solder in the composite bumps; and
   keeping the second body at a temperature less than the reflow temperature during the applying a magnetic field to the magnetic particles in the composite bumps to generate heat and reflow the solder in the composite bumps.

13. The method of claim 6, wherein the second body comprises a semiconductor chip including a plurality of pads comprising copper positioned thereon, and wherein the wherein the magnetic particles include a metal coating thereon, the metal coating comprising an alloy including copper and tin.

14. A method comprising:
   providing a first body with a plurality of bonding pads thereon;
   providing a solder layer on the bonding pads;
   forming plurality of composite bumps on the solder layer, the composite bumps comprising a solder and magnetic particles;
   applying a magnetic field to the magnetic particles to generate sufficient heat to melt the solder and form molten bump regions containing the magnetic particles therein;
   coupling a second body to the first body through the molten bump regions; and
   cooling the molten bump regions to form solidified composite bumps coupling the second body to the first body.

15. The method of claim 14, wherein the magnetic field is removed from the magnetic particles prior to the coupling the second body to the first body.

16. The method of claim 14, wherein the bonding pads comprise copper, and wherein the molten solder bump regions are coupled to the bonding pads.

17. The method of claim 14, wherein the first body comprises a substrate, and the second body comprises a semiconductor chip.

* * * * *

UNITED STATES PATENT AND TRADEMARK OFFICE
CERTIFICATE OF CORRECTION

PATENT NO. : 7,902,060 B2
APPLICATION NO. : 12/343341
DATED : March 8, 2011
INVENTOR(S) : Rajasekaran Swaminathan Page 1 of 1

It is certified that error appears in the above-identified patent and that said Letters Patent is hereby corrected as shown below:

In column 7, line 22, in Claim 13, after "and" delete "wherein the".

Signed and Sealed this
Seventeenth Day of May, 2011

David J. Kappos
*Director of the United States Patent and Trademark Office*